United States Patent
Cai et al.

(10) Patent No.: US 8,958,515 B2
(45) Date of Patent: Feb. 17, 2015

(54) SERDES JITTER TOLERANCE BIST IN PRODUCTION LOOPBACK TESTING WITH ENHANCED SPREAD SPECTRUM CLOCK GENERATION CIRCUIT

(75) Inventors: Yi Cai, Orefield, PA (US); Ivan Chan, Kanata (CA); Liming Fang, Allentown, PA (US); Max J. Olsen, Mertztown, PA (US)

(73) Assignee: LSI Corporation, Milpitas, CA (US)

( * ) Notice: Subject to any disclaimer, the term of this patent is extended or adjusted under 35 U.S.C. 154(b) by 704 days.

(21) Appl. No.: 13/096,454

(22) Filed: Apr. 28, 2011

(65) Prior Publication Data

US 2012/0189086 A1  Jul. 26, 2012

Related U.S. Application Data

(60) Provisional application No. 61/434,623, filed on Jan. 20, 2011.

(51) Int. Cl.
| | | |
|---|---|---|
| *H04L 7/00* | (2006.01) | |
| *H04L 25/00* | (2006.01) | |
| *H04L 25/40* | (2006.01) | |
| *G06G 7/16* | (2006.01) | |
| *G01R 31/317* | (2006.01) | |
| *H04B 15/04* | (2006.01) | |

(52) U.S. Cl.
CPC .. *G06G 7/16* (2013.01); *H04L 7/00* (2013.01); *G01R 31/31709* (2013.01); *H04B 15/04* (2013.01)
USPC ............................. 375/371; 375/354; 375/373

(58) Field of Classification Search
None
See application file for complete search history.

(56) References Cited

U.S. PATENT DOCUMENTS

| | | | |
|---|---|---|---|
| 7,849,370 B2 | 12/2010 | Moshe et al. | |
| 2002/0079982 A1* | 6/2002 | Lafleur et al. | 333/17.1 |
| 2002/0090917 A1* | 7/2002 | Hirano et al. | 455/76 |
| 2008/0012549 A1 | 1/2008 | Kam et al. | |
| 2008/0205541 A1* | 8/2008 | Rofougaran | 375/269 |
| 2009/0119554 A1 | 5/2009 | Dai et al. | |
| 2009/0177457 A1 | 7/2009 | Dai et al. | |
| 2009/0279642 A1* | 11/2009 | Zarei | 375/327 |
| 2010/0026314 A1 | 2/2010 | Schuttert | |
| 2010/0188129 A1 | 7/2010 | Ma | |
| 2010/0316105 A1* | 12/2010 | Suzuki et al. | |
| 2012/0263217 A1* | 10/2012 | Gossmann | 375/224 |

OTHER PUBLICATIONS

Shimanouchi, Masashi "Periodic Jitter Injection with Direct Time Synthesis by SPPtm ATE for SerDes Jitter Tolerance Test in Production"; ITC International Test Conference, 2003 IEEE; pp. 48-57.

* cited by examiner

*Primary Examiner* — Shuwang Liu
*Assistant Examiner* — Gina McKie (57) ABSTRACT

A system for controllably generating jitter in a serial data stream includes a frequency generator and first and second mixers. The frequency generator is configured to output in-phase and quadrature local oscillator signals with a local oscillator frequency of at least about 5 MHz. The local oscillator frequency varies between a selectable minimum frequency and a selectable maximum frequency. The first mixer is configured to mix a fixed frequency clock signal with the in-phase local oscillator signal to output a first mixer output. The second mixer is configured to mix the fixed frequency clock signal with the quadrature local oscillator signal to output a second mixer output. An adder is configured to add the first and second mixer outputs to produce a frequency-modulated clock signal with a frequency that is about the sum of the fixed frequency and the local oscillator frequency and includes a periodic jitter.

20 Claims, 7 Drawing Sheets

SERDES JITTER TOLERANCE BIST IN PRODUCTION LOOPBACK TESTING WITH ENHANCED SPREAD SPECTRUM CLOCK GENERATION CIRCUIT

CROSS-REFERENCE TO RELATED APPLICATION

This application claims the benefit of U.S. Provisional Application Ser. No. 61/434,623, filed by Cai, et al. on Jan. 20, 2011 entitled "SerDes Jitter Tolerance BIST in Production Loopback Testing with Enhanced Spread Spectrum Clock Generation Circuit", commonly assigned with this application and incorporated herein by reference.

TECHNICAL FIELD

This application is directed, in general, to systems and methods for automated testing of electronic devices.

BACKGROUND

The evolvement of backplanes from bus-based architectures to fabric/mesh-based architectures has fueled rapid deployment of multi-gigabit serializer and de-serializer (SerDes) devices. The serializer does not transmit a dedicated clock signal. Instead the deserializer needs to have the capability to lock to the received data signal, extract the clock/timing information, retime/resample the received signal with the recovered clock, and make correct detections of the intended transmitted signal. As a result, the two key circuit blocks in the receiver are the clock and data recovery (CDR) and the equalizers (EQ). The former functions to extract the timing information and always ensures the data latches stay in the center of the data eye. The latter is to reshape the signal such that logic one is correctly distinguished from logic zero, and vice versa.

In addition, because of the leading edge speed of the SerDes devices, the serial data rates under test are generally faster than what the tester can support. So in many cases, looping back the Tx to Rx for a self test is used. However, a jitter free loopback test rarely represents the real application environment.

The industry recognized method of exercising the CDR circuit is through the compliance jitter tolerance (CJT) test. Jitter is defined as deviation of an actual signal edge from the ideal position, which has many contributing components (e.g. DCD, ISI, PJ, RJ, etc). The periodic jitter (PJ), also referred to as the sinusoidal jitter (SJ), is commonly used in jitter tolerance tests by modulating the signal before it reaches receiver inputs. Two parameters that define the periodic jitter are the jitter amplitude and the jitter frequency. The CDR circuit reacts differently to different periodic jitter frequencies. When the periodic jitter frequency is low and within the bandwidth of the CDR, the CDR could track the jitter and move along with the jittery signal edges. In that case, the recovered clock stays in the center of the data eye. However when the periodic jitter frequency goes higher than the CDR tracking band, the jitter cuts into the timing recovery margin for the CDR.

Precision periodic jitter generation has been an important component of electrical compliance test methodology on many serial data communication standards. Despite the importance of jitter testing, test methods and equipment targeted for volume production ATE applications are not widely available. This is partially attributed to the fact that the leading edge SerDes development has outpaced the tracking capability for many testing platforms including ATE.

Conventional ATE testing typically includes internal and external loopback tests. Although the PCB traces used in loopback create some ISI type of jitter, such jitter typically is not sufficient to provide a rigorous CDR stress test. It is typically difficult to control or even quantify the amount of ISI generated through these PCB traces. And because of layout constraints, it may not be possible to tune the traces length for a large number of SerDes ports on the same PCB. Therefore, loopback functional test alone is inadequate for CDR test coverage. As a result, the devices with marginal performance can escape from production test and cause system failures for the customers. Such problems are very difficult to debug once in a system and the replacement cost is extremely high.

SUMMARY

One embodiment provides a system for controllably generating jitter in a serial data stream. The system includes a frequency generator and first and second mixers. The frequency generator is configured to output in-phase and quadrature local oscillator signals with a local oscillator frequency of at least about 5 MHz. The local oscillator frequency varies between a selectable minimum frequency and a selectable maximum frequency. The first mixer is configured to mix a fixed frequency clock signal with the in-phase local oscillator signal to output a first mixer output. The second mixer is configured to mix the fixed frequency clock signal with the quadrature local oscillator signal to output a second mixer output. An adder is configured to add the first and second mixer outputs to produce a frequency-modulated clock signal with a frequency that is about the sum of the fixed frequency and the local oscillator frequency and includes a periodic jitter.

Another embodiment provides a method of forming an electronic device. The method includes forming a frequency generator and first and second mixers. The frequency generator is configured to output in-phase and quadrature local oscillator signals with a local oscillator frequency of at least about 5 MHz. The local oscillator frequency varies between a selectable minimum frequency and a selectable maximum frequency. The first mixer is configured to mix a fixed frequency clock signal with the in-phase local oscillator signal to output a first mixer output. The second mixer is configured to mix the fixed frequency clock signal with the quadrature local oscillator signal to output a second mixer output. The method further includes forming an adder configured to add the first and second mixer outputs. The mixing produces a frequency-modulated clock signal with a frequency that is about the sum of the fixed frequency and the local oscillator frequency and includes a periodic jitter.

BRIEF DESCRIPTION

Reference is now made to the following descriptions taken in conjunction with the accompanying drawings, in which.

DETAILED DESCRIPTION

Some conventional spread-spectrum clocking (SSC) implementations actively modulate the PLL divider ratios to generate the SSC frequency profile for jitter injection. However, such modulation is typically too slow to generate out-of-band jitter frequency needed for more realistic testing of the receiver clock and data recovery circuits. Therefore, the need exists for jitter tolerance test on ATE. It is desirable that such functionality be cost effective and time efficient for high volume production.

This disclosure presents an innovative design-for-test (DFT) implementation for jitter tolerance testing in a production loopback mode of an integrated circuit (IC), e.g. a SerDes device. An on-chip circuit leverages existing SSC circuitry to generate jitter that may exceed the bandwidth of receiver clock and data recovery circuits of a receive block on the IC. The jitter generation is implemented such that the jitter appears to an ATE system as an external loopback with no add-on circuits. Embodiments of the disclosure may be easily integrated with other functional tests, making high-bandwidth jitter tolerance testing practical for high volume production testing.

Figure 1:
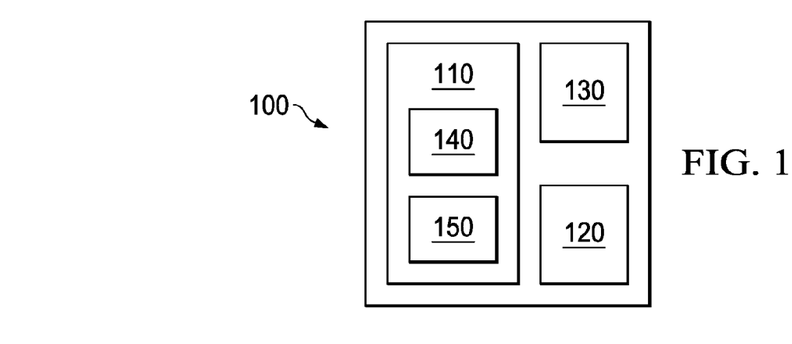
FIG. 1 illustrates an electronic device, e.g. an integrated circuit, that includes a spread spectrum clocking (SSC) generator, such as that illustrated in FIG. 2.

FIG. 1 illustrates an electronic device 100 of the disclosure, e.g. an IC. The IC includes a semiconductor substrate with circuit elements formed thereover, such as transistors, gates and metal interconnects. The electronic device 100 includes functional circuitry 110, memory 120 and a clock generation subsystem 130.

The functional circuitry 110 and memory 120 are representative of various conventional circuits and functions that may be located on the electronic device 100. In particular the functional circuitry 110 may include a receiver stage 140 and a transmitter stage 150 of a serializer/de-serializer (SerDes) subsystem of the electronic device 100. The clock generation subsystem 130 includes functionality to produce a spread-spectrum clock signal. The clock generation subsystem 130 further includes functionality to controllably produce jitter in a loopback test mode to provide realistic self-test conditions to portions of the receiver stage 140.

Figure 2:
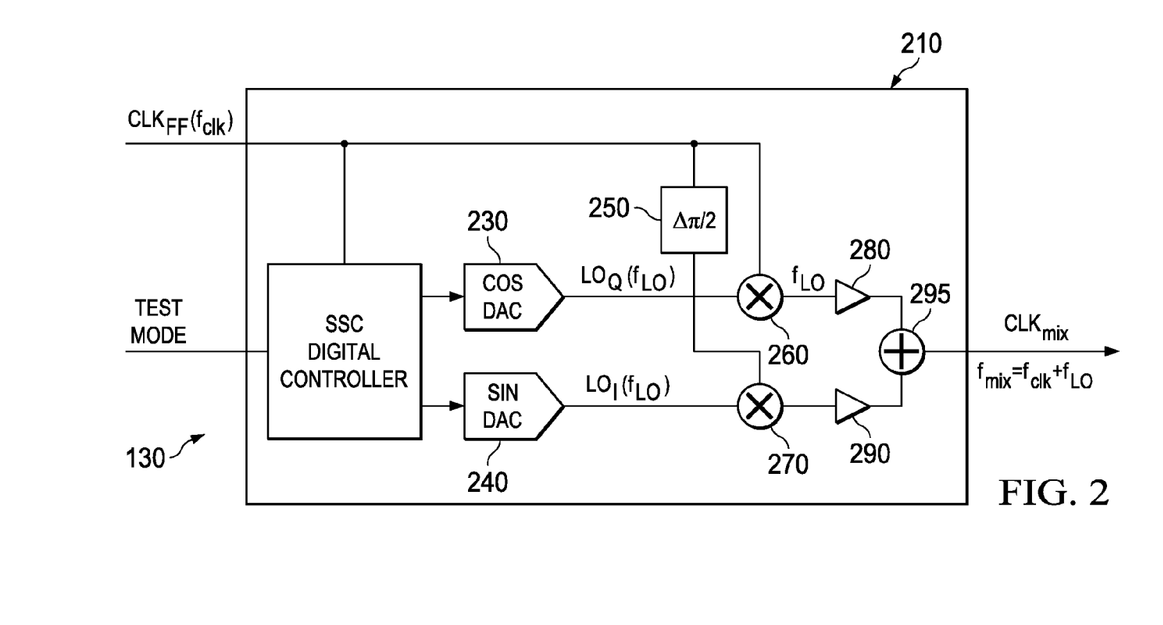
FIG. 2 illustrates a clock generator subsystem of the disclosure configured to produce periodic jitter on a serial data stream.

FIG. 2 illustrates a frequency generator 210 of a clock generation subsystem, such as the clock generation subsystem 130. The frequency generator 210 is configured to receive a fixed frequency clock signal $CLK_{FF}$ and to output a clock signal $CLK_{MIX}$, aspects of which are described further below. The $CLK_{FF}$ may be, e.g. a system clock of the electronic device 100 with a frequency $f_{clk}$. In various embodiments the $CLK_{FF}$ clocks the transmitter stage 150 during normal operation (a.k.a. "mission mode") of the electronic device 100. The $CLK_{FF}$ may be produced, e.g. by a voltage control oscillator (VCO), not shown. By "fixed frequency", it is meant that the $CLK_{FF}$ has a frequency that is not typically modulated, such as a system or master clock of the electronic device 100. For example, a change of the frequency of the $CLK_{FF}$ by changing an operating point of a VCO is not inconsistent with characterizing the $CLK_{FF}$ as fixed frequency, nor are slow changes in frequency due to, e.g. temperature or supply voltage.

In some embodiments the frequency generator 210 may be a portion of a SSC subsystem of the electronic device 100. As appreciated by those skilled in the pertinent art, an SSC subsystem may generate a sweep frequency to spread the peak spectral peak of the $CLK_{FF}$ across a range a frequencies, e.g. for EMI reduction.

The inventors have recognized that the frequency generator 210 may be used in a new and innovative manner to generate controllable jitter for self-testing of an electronic device, e.g. a serializer/de-serializer. As described further below, such jitter may exceed the bandwidth of a receiver of the serializer/de-serializer, providing a realistic self-test of the receiver performance. In many cases the jitter generator may be used without the need for external calibration, significantly simplifying testing protocols. The self-test may appear to an external automated test equipment (ATE) system as an external loopback with no additional circuits. Finally, because the jitter is fully synthesized on the electronic device, jitter testing is expected to be independent of the particular ATE platform used.

While embodiments of the disclosure are not limited to use of components of an existing SSC subsystem, such use may be advantageous in that the SSC subsystem may be leveraged for use as described herein with little impact on the overall area used by the electronic device 100. As such embodiments are described herein with reference to the frequency generator 210 being a portion of an SSC subsystem. Those skilled in the pertinent art are knowledgeable of alternatives to using the SSC subsystem, such as adding redundant circuitry.

The frequency generator 210 includes an SSC controller 220. In the illustrated embodiment the SSC controller 220 is a digital controller. The controller 220 receives the $CLK_{FF}$ and a test mode signal, and outputs digital values to a cosine digital-to-analog converter (DAC) 230 and a sine DAC 240. The sine DAC 240 produces an in-phase (I) component of a local oscillator (LO), $LO_I$ with a frequency $f_{LO}$. The cosine DAC 230 produces a quadrature (Q) component of the LO, $LO_Q$, also having the frequency $f_{LO}$. A phase delay 250 produces a quadrature component of the $CLK_{FF}$, designated $QCLK_{FF}$. Typically $f_{clk}$ is about 1 GHz or greater. In conventional operation of the frequency generator 210, as described further below, $f_{LO}$ is typically about 100 KHz. In contrast, for various embodiments described herein $f_{LO}$ may be 1 MHz or greater.

A mixer 260 receives the $CLK_{FF}$ and $LO_Q$ and outputs mixing products thereof. A mixer 270 receives the $QCLK_{FF}$ and $LO_I$ and outputs mixing products thereof. Amplifiers 280, 290, e.g. variable gain amplifiers (VGAs) respectively scale the outputs of the mixers 260, 270. An adder 295 adds the scaled outputs and outputs a $CLK_{MIX}$ signal with a frequency $f_{mix}$. The $CLK_{MIX}$ has a frequency $f_{mix}$ equal to or about equal to $f_{clk}+f_{LO}$. See, e.g. U.S. Patent Application No. 2010/0188129, incorporated herein by reference in its entirety.

In various embodiments the adder 295 is separated from a main VCO feedback loop associated with generation of the CLK$_{FF}$. In this way, the VCO modulation bandwidth is not compromised by stability factor needs.

Conventional spread spectrum operation typically includes sweeping the frequency of the LO between a minimum and a maximum frequency. The range between the minimum and the maximum is typically a small fraction (300-5000 ppm) of f$_{clk}$. Thus, f$_{mix}$ is spread between two frequencies near f$_{clk}$ with a range determined by the minimum and a maximum frequency of the LO.

The controller 220 receives a test mode signal that instructs the controller to operate in mission mode or in a test mode described below. In mission mode, the controller 220 may sweep the LO at a low frequency between a minimum frequency and a maximum frequency to sweep the CLK$_{FF}$ to reduce EMI, as described previously. As an example, typical values of a sweep waveform, e.g. the LO frequency vs. time, may describe a smoothly varying function such as a triangle wave. In conventional applications a smoothly varying function is typically preferred so that the spectral energy of the CLK$_{FF}$ is evenly distributed over the sweep range. In such applications the maximum frequency of the sweep function is typically 100 kHz or less. It is thought that a sweep function frequency greater than about 100 kHz in mission mode may place too great a burden on the receiver to accommodate the variable timing of data transmitted by the device 100. Moreover, it is expected that limiting the sweep function frequency to about 100 kHz or less increases the compatibility between the electronic device 100 produced by one manufacturer and a SerDes device produced by a different manufacturer. Conversely, in embodiments described herein an objective is to stress the receiver block (described below) with a sweep frequency that exceeds the input bandwidth of the receiver. This aspect is described in detail below.

In some cases the test mode signal instructs the controller 220 to operate in a test mode. In various embodiments, the controller 220 operates in the test mode to produce an LO signal that is significantly different from the LO produced during mission mode. In one aspect the minimum frequency of the sweep function is at least about 1 MHz, i.e. ten times the maximum frequency of the sweep frequency in mission mode. In another aspect the sweep function in test mode may not be smoothly varying. For example, the sweep function may be about a square wave, e.g. toggling between a maximum LO frequency and a minimum LO frequency.

Figure 3:
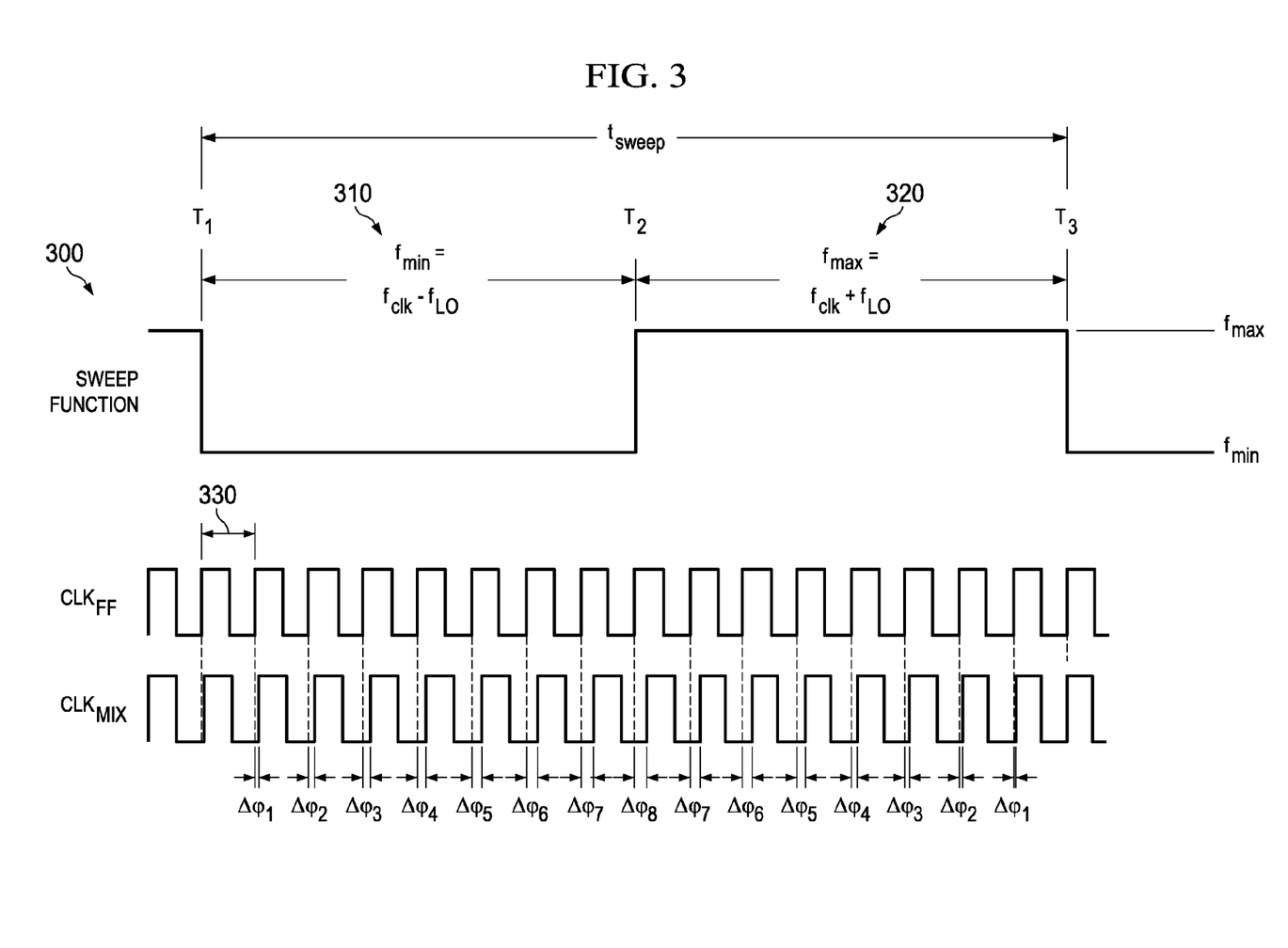
FIG. 3 illustrates a test mode sweep function, including relationships between an unmodulated clock signal input to the subsystem of FIG. 2, a clock signal modulated to produce periodic jitter by control of a maximum and minimum local oscillator frequency and a duration of the maximum and minimum frequencies.

FIG. 3 illustrates an example of one specific embodiment of a test mode sweep function 300. CLK$_{FF}$ is illustrated for reference. The function 300 has a sweep period t$_{sweep}$ and a sweep amplitude f$_{max}$–f$_{min}$. The function 300 has a sweep frequency f$_{sweep}$, e.g. corresponding to 1/t$_{sweep}$. During one portion of t$_{sweep}$ the LO frequency is about f$_{min}$=f$_{clk}$–f$_{LO}$. During another portion of t$_{sweep}$ the LO frequency is about f$_{max}$=f$_{clk}$+f$_{LO}$. In various embodiments the CLK$_{LO}$ is synchronous with CLK$_{FF}$.

In some embodiments the sweep function 300 is a square wave, as illustrated. In such cases the LO frequency is substantially described as being in one of two states, f$_{max}$ or f$_{min}$. In some other embodiments the sweep function 300 may include portions in which the LO frequency changes smoothly with time, e.g. a triangle wave, sine wave or sawtooth wave. The sweep function 300 is shown as having a duty cycle of about 50%, but embodiments are not limited thereto.

A waveform CLK$_{MIX}$ represents the output of the adder 295. During a period 310 between T$_1$ and T$_2$, CLK$_{mix}$ has a frequency of about f$_{clk}$–f$_{LO}$. During a period 320 between T$_2$ and T$_3$ CLK$_{mix}$ has a frequency of about f$_{clk}$+f$_{LO}$.

During the period 310, the phase of CLK$_{mix}$ increasingly lags relative to CLK$_{FF}$ during each period of CLK$_{FF}$. Thus, one full period 330 after T$_1$, the phase of the CLK$_{mix}$ clock lags the CLK$_{FF}$ by Δφ$_1$. Two full periods 330 after T$_1$, the phase of the CLK$_{mix}$ clock lags the CLK$_{FF}$ clock by Δφ2. Eight full periods 330 after T$_1$, i.e. at time T$_2$, the phase of the CLK$_{mix}$ clock lags the CLK$_{FF}$ by Δφ$_8$.

At time T$_2$, the frequency of the LO increases to f$_{max}$, and the frequency of the CLK$_{mix}$ increases to f$_{FF}$+f$_{LO}$. Thus, one period 330 of CLK$_{FF}$ after T$_2$ the phase of CLK$_{mix}$ is incrementally reduced, and CLK$_{mix}$ lags CLK$_{FF}$ by only Δφ$_7$, i.e. less than Δφ$_8$. The phase lag decreases with each period of CLK$_{FF}$ until Δφ=0 at T$_3$.

Thus, control of the LO frequency results in a precise digitally controlled phase error accumulation from the frequency offset and duration of the offset of the CLK$_{mix}$ from CLK$_{FF}$. In various embodiments an effective periodic jitter can be produced with a frequency within the range of about 3 MHz to about 150 MHz. The amplitude of the periodic jitter is also programmable from 0 to a full unit interval (UI).

Figure 4:
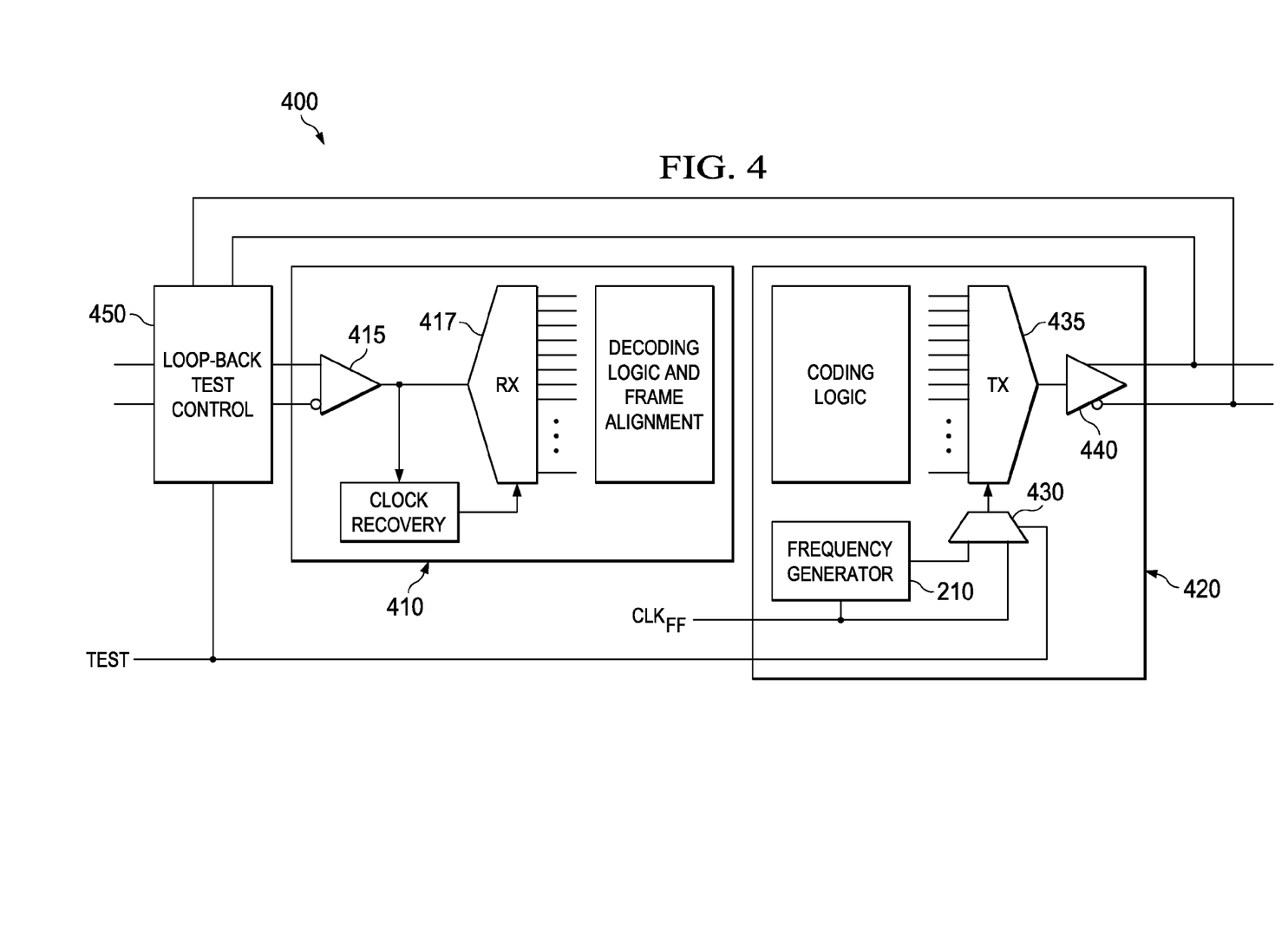
FIG. 4 illustrates an illustrative embodiment of portions of a serializer-deserializer (SerDes) system using the clock generator subsystem of FIG. 2 and configured to provide loopback test capability.

FIG. 4 shows an illustrative embodiment of portions of a SerDes system 400 configured to provide loop-back test capability. A receive stage 410, that may be conventional, receives serial data via an input buffer 415. A clock recovery circuit and a receive shift register 417 operate to recover data from the received data stream. A transmit stage 420 includes the frequency generator 210, but may be otherwise conventional. Under control of a test signal, e.g. from an ATE system, the transmit stage 420 operates the frequency generator 210 to produce the CLK$_{mix}$ clock signal. The ATE may control a multiplexer 430 to select the CLK$_{mix}$ clock to clock a transmit shift register 435. A transmit buffer 440 receives the serial data stream from the shift register and provides a buffered signal at its output.

A loop-back test control 450 receives the buffered transmit data. Under control of the ATE, the test control 450 selects the buffered transmit data for input to the input buffer 415. The buffered transmit data includes jitter produced by the frequency generator 210, thereby stressing the receive stage 410. Advantageously, the illustrated loop-back test configuration appears to the ATE as a simple loop-back test, while providing jitter to stress the receive stage 410.

Figure 5A:
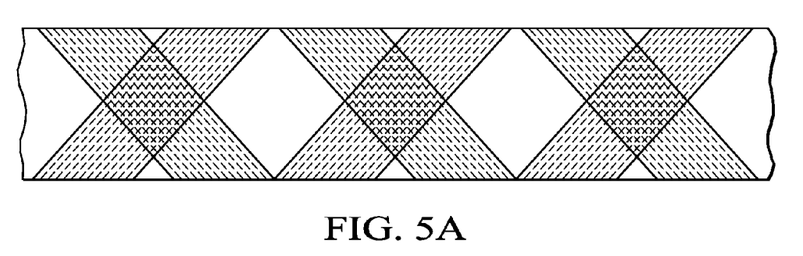
FIGS. 5A and 5B illustrate eye diagrams that result from periodic jitter produced by various embodiments.
Figure 5B:
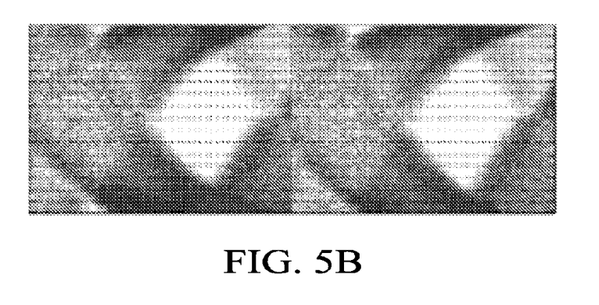

FIGS. 5A and 5B illustrate the data output by the transmit stage 420 presented in eye-diagram format. FIG. 5A illustrates an idealized view of the data including the jitter superimposed by the frequency generator 210. FIG. 5B illustrates a data eye plot determined from modeled performance of a typical embodiment. These eye plots are qualitatively similar to expected eye plots due to jitter during normal communication between SerDes devices, and therefore a valuable test of the receive stage 410 sensitivity to jitter in the received data stream. The timing margins as represented by the open area of the eye diagram can be controlled by controlling the magnitude of the periodic jitter as described herein. Thus, operating margins may be controllably tested in the loopback test mode described above.

As mentioned previously the jitter produced by the frequency generator 210 may be precisely controlled by the selection of f$_{LO}$. It can be shown that the periodic jitter PJ at the output of the adder 295 may be described by Eq. 1:

$$PJ_{in\_UI} = \frac{ofst_{ppm} \times f_{BAUD}}{2 \times 10^6 \times F_{PJ}} \quad (1)$$

Where:
ofst$_{ppm}$ is the frequency offset between f$_{max}$ and fmin in parts per million of f$_{CLK}$;

$F_{baud} = f_{clk}$; and $F_{PJ}$ is the frequency of PJ injected.

Figure 6:
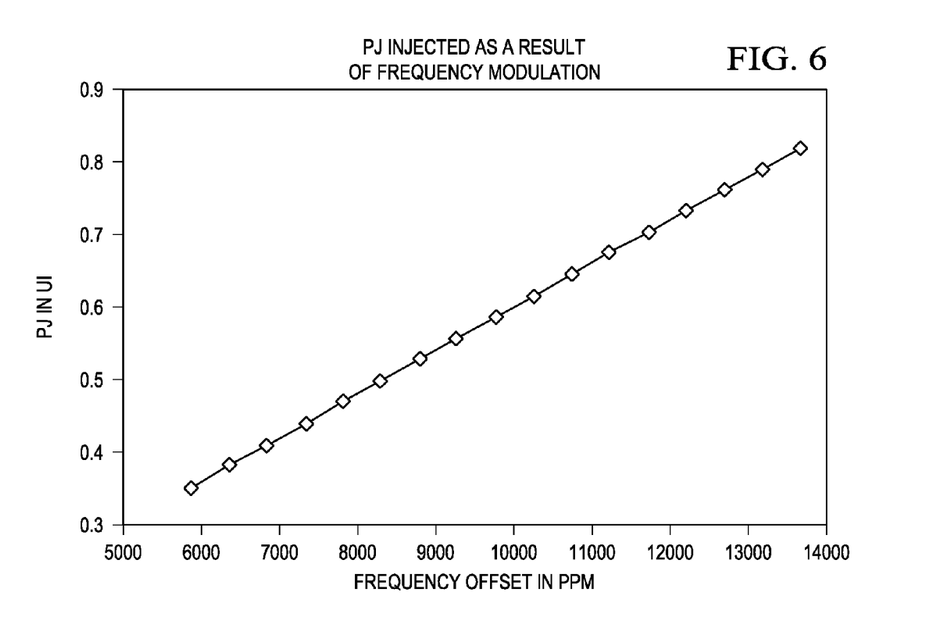
FIG. 6 illustrates a calculated relationship between periodic jitter and an offset frequency of the local oscillator, e.g. one half of the difference between the maximum and minimum local oscillator frequencies.

FIG. 6 illustrates a calculated characteristic of the periodic jitter in units of UI as a function of frequency offset of $CLK_{FF}$ in parts per million of the $CLK_{FF}$. The calculated periodic jitter is linear with a slope of $$\frac{F_{baud}}{2 \times 10^6 \times F_{PJ}}.$$

Figure 7:
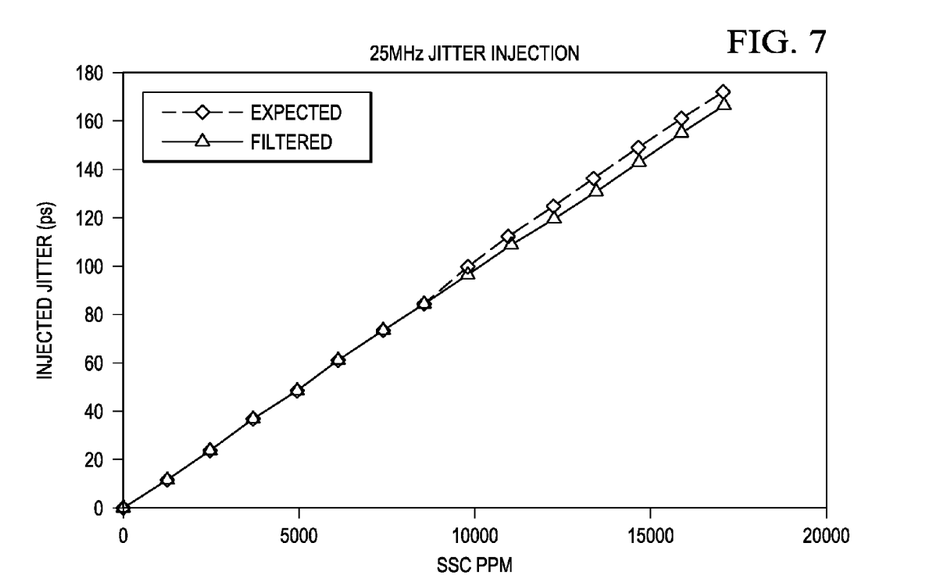
FIG. 7 illustrates calculated and measured periodic jitter for one specific embodiment.

FIG. 7 illustrates calculated (dashed line) and measured (solid) periodic jitter as a function of $ofst_{ppm}$ for one specific embodiment of the electronic device 100. The periodic jitter frequency is set by fixing $f_{sweep}$ to 25 MHz, and the sweep frequency offset through the digital control logic of the controller 220.

The measured periodic jitter closely follows the calculated periodic jitter, confirming the relationship of Eq. 1. Advantageously, the measured periodic jitter is produced without any calibration by external signals. The ability to produce the periodic jitter without calibration using only two variables, $F_{baud}$ and $F_{PJ}$ provides a valuable mechanism to inject controllable jitter into the receiver stage 140. The jitter may exceed the input bandwidth of the receive stage 410, resulting in a meaningful test of the receive stage 410.

As mentioned previously no external calibration is needed with various embodiments of the disclosure. Eq. 1 shows that two variables digitally control the jitter injection amount. The frequency offset accuracy is inherently determined by the resolution of the digital control provided by the controller 220. Moreover, precise control of the period of $t_{sweep}$ allows the accumulation of phase shift of $CLK_{mix}$ over multiple clock cycles. Thus the accumulated maximum phase shift directly translates to the amount of periodic jitter produced.

Figure 8:
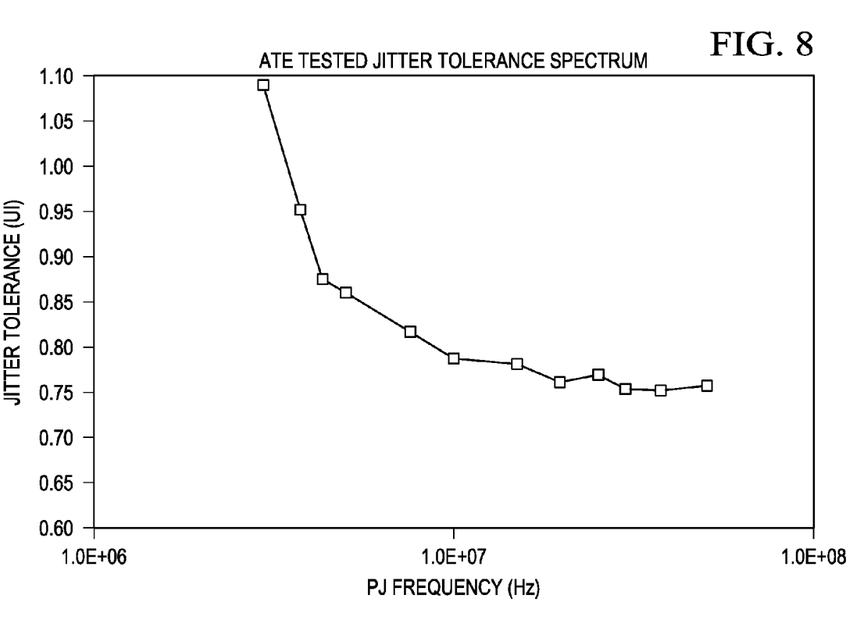
FIG. 8 illustrates jitter tolerance of a tested electronic device in one specific embodiment.

FIG. 8 illustrates the jitter tolerance determined for a fabricated electronic device 100 for various frequencies $f_{sweep}$ of the sweep function 300. The lowest frequency of the illustrated jitter tolerance characteristic is about 3 MHz. As $f_{sweep}$ increases the tolerance characteristic displays a clear transition around the receiver tracking band of a few MHz. Below the tracking bandwidth of the clock and data recovery circuits of the receive stage 410, a large amount low frequency jitter (i.e. ≥1 UI) is not sufficient to stress the receive stage 410. When $f_{sweep}$ exceeds about 5 MHz the jitter frequency reaches beyond the receiver tracking band, and the jitter tolerance curve flattens out.

Figure 9:
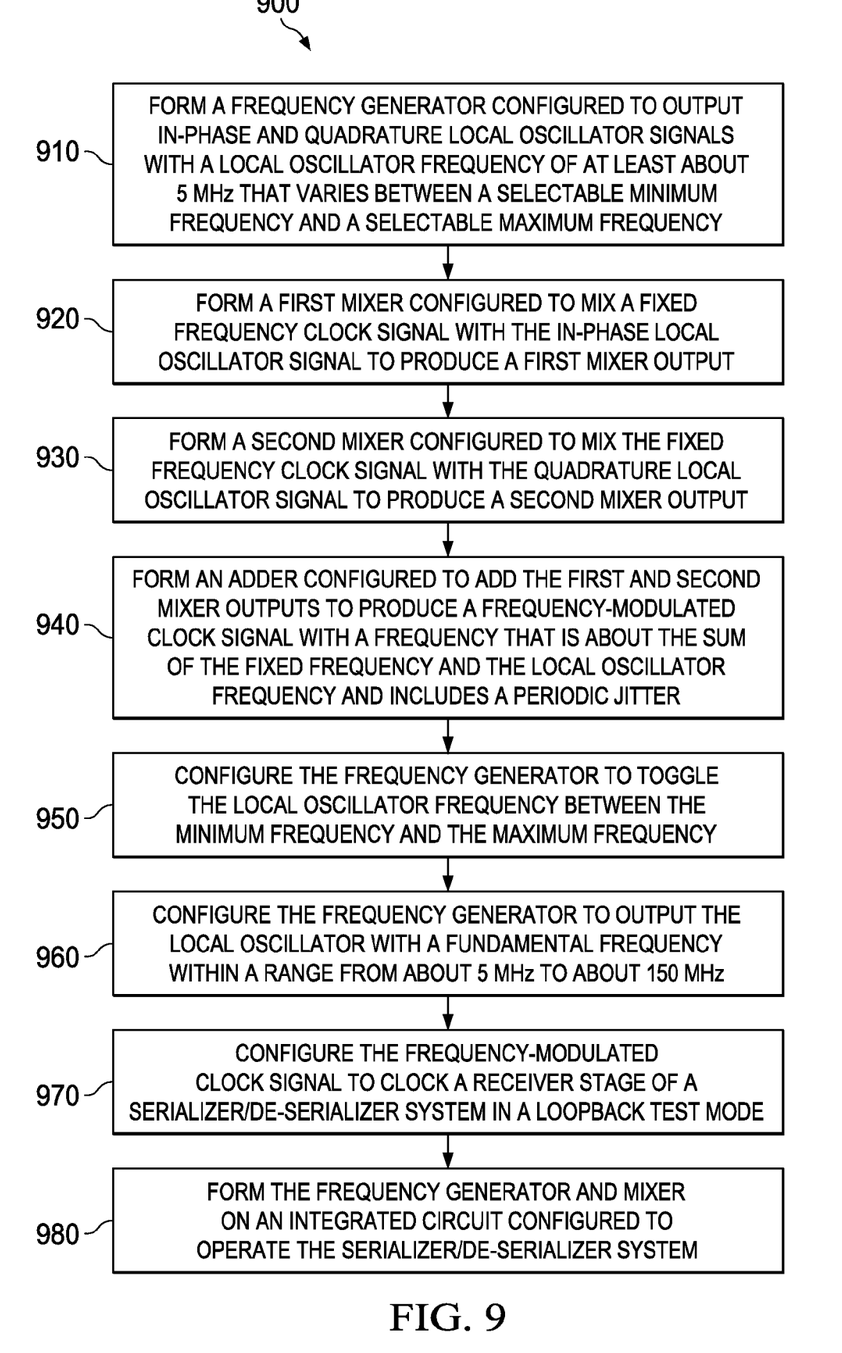
FIG. 9 illustrates a method of forming an electronic device, e.g. the electronic device of FIG. 1, that includes the clock generation subsystem of FIG. 2.

Turning now to FIG. 9, a method 900 is presented for forming an electronic device, e.g. the electronic device 100. The method 900 is described without limitation with reference to various elements described herein, e.g. in FIGS. 1-8. The method 900 may be performed in an order different than the illustrated order.

A step 910 includes forming a frequency generator, e.g. the SSC controller 220. The frequency generator is configured to output a local oscillator signal with a local oscillator frequency of at least about 5 MHz. The local oscillator frequency is configured to vary between a selectable minimum frequency and a selectable maximum frequency, illustratively described in FIG. 3.

A step 920 includes forming a first mixer, e.g. the mixer 260. The first mixer is configured to mix the local oscillator signal with an in-phase fixed frequency clock signal, e.g. $CLK_{FF}$, thereby producing a first mixer output. A step 930 includes forming a second mixer, e.g. the mixer 270. The second mixer is configured to mix the local oscillator signal with a quadrature fixed frequency clock signal, thereby producing a second mixer output. In a step 940 an adder, e.g. the adder 295, is configured to add the first and second mixer outputs, thereby forming a frequency-modulated clock signal. The frequency-modulated clock signal has a frequency that is about the sum of the fixed frequency and the local oscillator frequency and includes a periodic jitter.

In a step 950 the frequency generator is further configured to toggle the local oscillator frequency between the minimum frequency and the maximum frequency. The local oscillator frequency may toggle with a toggle period that has a duty cycle of about 50%. The local oscillator may be synchronous with the fixed frequency clock signal. The fixed frequency clock and the local oscillator may be in phase at a beginning and an end of a modulation period of the frequency-modulated clock signal.

In a step 960 the frequency generator is further configured to output the local oscillator with a fundamental frequency within a range from about 5 MHz to about 150 MHz. In a step 970 the frequency-modulated clock signal is further configured to clock a receiver stage of a serializer/de-serializer system in a loopback test mode. In a step 980 the frequency generator and mixer are formed on an integrated circuit configured to operate the serializer/de-serializer system.

Those skilled in the art to which this application relates will appreciate that other and further additions, deletions, substitutions and modifications may be made to the described embodiments.

What is claimed is:

1. A system for controllably generating jitter in a serial data stream, comprising:
   a frequency generator configured to output in-phase and quadrature local oscillator signals with a local oscillator frequency of at least 5 MHz that varies between a selectable minimum frequency and a selectable maximum frequency;
   a first mixer configured to mix a fixed frequency clock signal with said in-phase local oscillator signal to output a first mixer output;
   a second mixer configured to mix said fixed frequency clock signal with said quadrature local oscillator signal to output a second mixer output; and
   an adder configured to add said first and second mixer outputs to produce a frequency- modulated clock signal with a frequency that is about the sum of the fixed frequency and the local oscillator frequency and includes a periodic jitter that corresponds to said selectable minimum frequency and said selectable maximum frequency.

2. The system of claim 1, wherein said frequency generator is further configured to toggle said local oscillator frequency between said minimum frequency and said maximum frequency.

3. The system of claim 2, wherein said local oscillator frequency toggles with a toggle period that has a duty cycle of about 50%.

4. The system of claim 1, wherein said local oscillator is synchronous with said fixed frequency clock signal.

5. The system of claim 1, wherein said frequency generator is further configured to output said local oscillator with a fundamental frequency within a range from about 5 MHz to about 150 MHz.

6. The system of claim 1, wherein said fixed frequency clock and said local oscillator are in phase at a beginning and an end of a modulation period of said frequency-modulated clock signal.

7. The system of claim 1, wherein a phase difference between said fixed-frequency clock signal and said frequency-modulated clock signal is programmable within a range from about 0 UI to about 1 UI.

8. The system of claim 1, wherein said frequency-modulated clock signal is configured to clock a receiver stage of a serializer/de-serializer system in a loopback test mode.

9. The system of claim 8, wherein said frequency generator and mixer are formed on an integrated circuit configured to operate said serializer/de-serializer system.

10. The system of claim 1, wherein said periodic jitter is linearly proportional to a difference between said minimum and maximum frequencies.

11. A method of forming an electronic device, comprising:
forming a frequency generator configured to output in-phase and quadrature local oscillator signals with a local oscillator frequency of at least 5 MHz that varies between a selectable minimum frequency and a selectable maximum frequency;
forming a first mixer configured to mix a fixed frequency clock signal with said in-phase local oscillator signal to output a first mixer output;
forming a second mixer configured to mix said fixed frequency clock signal with said quadrature local oscillator signal to output a second mixer output; and
forming an adder configured to add said first and second mixer outputs to produce a frequency-modulated clock signal with a frequency that is about the sum of the fixed frequency and the local oscillator frequency and includes a periodic jitter that corresponds to said selectable minimum frequency and said selectable maximum frequency.

12. The method of claim 11, further comprising configuring said frequency generator to toggle said local oscillator frequency between said minimum frequency and said maximum frequency.

13. The method of claim 12, wherein said local oscillator frequency toggles with a toggle period that has a duty cycle of about 50%.

14. The method of claim 11, wherein said local oscillator is synchronous with said fixed frequency clock signal.

15. The system of claim 11, further comprising configuring said frequency generator to output said local oscillator with a fundamental frequency within a range from about 5 MHz to about 150 MHz.

16. The method of claim 11, wherein said fixed frequency clock and said local oscillator are in phase at a beginning and an end of a modulation period of said frequency-modulated clock signal.

17. The method of claim 11, wherein a phase difference between said fixed-frequency clock signal and said frequency-modulated clock signal is programmable within a range from about 0 UI to about 1 UI.

18. The method of claim 11, further comprising configuring said frequency-modulated clock signal to clock a receiver stage of a serializer/de-serializer system in a loopback test mode.

19. The method of claim 18, further comprising configuring forming said frequency generator and mixer on an integrated circuit configured to operate said serializer/de-serializer system.

20. The method of claim 11, wherein said periodic jitter is linearly proportional to a difference between said minimum and maximum frequencies.

* * * * *